(12) United States Patent
Doyle et al.

(10) Patent No.: US 10,561,020 B2
(45) Date of Patent: Feb. 11, 2020

(54) PIN ARRAY INCLUDING SEGMENTED PINS FOR FORMING SELECTIVELY PLATED THROUGH HOLES

(71) Applicant: International Business Machines Corporation, Armonk, NY (US)

(72) Inventors: Matthew S. Doyle, Chatfield, MN (US); Jeffrey N. Judd, Oronoco, MN (US); Joseph Kuczynski, North Port, FL (US); Scott D. Strand, Rochester, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 15/668,284

(22) Filed: Aug. 3, 2017

(65) Prior Publication Data

US 2019/0045629 A1 Feb. 7, 2019

(51) Int. Cl.
*H01K 3/10* (2006.01)
*H05K 1/11* (2006.01)
(Continued)

(52) U.S. Cl.
CPC ............ *H05K 1/115* (2013.01); *H05K 1/181* (2013.01); *H05K 3/32* (2013.01); *H05K 3/429* (2013.01);
(Continued)

(58) Field of Classification Search
CPC .......... H01L 2924/15312; H01L 33/62; H05K 2201/0969; H05K 7/205; Y10T 29/49126;
(Continued)

(56) References Cited

U.S. PATENT DOCUMENTS 6,179,631 B1 * 1/2001 Downes ............ H01R 43/0256
228/246
6,521,842 B2 * 2/2003 Brinthaupt, III ..... H05K 1/0201
174/252
(Continued)

OTHER PUBLICATIONS

Kim et al., *Microheater Array*, Project by the Phase Change Heat Transfer Laboratory, Mechanical Engineering Department, University of Maryland (online, enme.umd.edu), accessed Feb. 23, 2016, 3 pages, URL: www.enme.umd.edu/~kimjh/Microheater.html.

*Primary Examiner* — Thiem D Phan
(74) *Attorney, Agent, or Firm* — Nolan M. Lawrence

(57) ABSTRACT

A process includes utilizing a pin array that includes multiple segmented pins for forming selectively plated through holes. The process includes forming a PCB laminate structure that includes multiple spinel-doped core layers and multiple through holes. Each spinel-doped core layer includes a heat-activated spinel material incorporated into a dielectric material. The process includes aligning individual segmented pins of a pin array with corresponding through holes of the PCB laminate structure, where each segmented pin includes heated segment(s) and insulating segment(s). The process includes inserting the segmented pins of the pin array into the corresponding through holes and generating heat within each heated pin segment that is sufficient to form metal nuclei sites in selected regions of the spinel-doped core layers adjacent to portions of the through holes that contain the heated pin segments. The metal nuclei sites function as seed layers to enable formation of selectively plated through holes.

17 Claims, 7 Drawing Sheets

(51) Int. Cl.
*H05K 3/42* (2006.01)
*H05K 1/18* (2006.01)
*H05K 3/32* (2006.01)

(52) U.S. Cl.
CPC ............ *H05K 2201/0187* (2013.01); *H05K 2201/096* (2013.01); *H05K 2203/0242* (2013.01); *Y10T 29/49165* (2015.01)

(58) Field of Classification Search
CPC ....... Y10T 428/24917; Y10T 29/49139; Y10T 29/49165; Y10T 29/4913; Y10T 29/49144; Y10T 29/49155; H01R 13/03; Y10S 439/948
USPC ......... 29/852, 825, 829, 837, 846, 849, 851, 29/854
See application file for complete search history.

(56) References Cited

U.S. PATENT DOCUMENTS

| | | |
|---|---|---|
| 6,541,712 B1 | 4/2003 | Gately et al. |
| 7,604,491 B1 * | 10/2009 | Ahmad ................. H05K 3/308 439/82 |
| 8,528,203 B2 | 9/2013 | Balcome et al. |
| 8,963,020 B2 | 2/2015 | Buchwalter et al. |
| 2012/0211273 A1 | 8/2012 | Kuczynski et al. |
| 2012/0312589 A1 | 12/2012 | Balcome et al. |
| 2014/0262455 A1 | 9/2014 | Iketani et al. |

* cited by examiner

PIN ARRAY INCLUDING SEGMENTED PINS FOR FORMING SELECTIVELY PLATED THROUGH HOLES

BACKGROUND

Plated through holes (PTHs) possessing via stubs can significantly distort high speed digital signals that pass through such PTHs. This distortion may be severe and may increase as the data rate increases. A conventional technique known as backdrilling can be used to remove via stubs. Backdrilling uses controlled depth drilling techniques to remove the undesired conductive plating in the via stub region. Typically, the via stub region is removed using a drill bit slightly larger in diameter than the drill bit that was used to create the original via hole. Decreasing via stub length by backdrilling may significantly reduce a particularly problematic form of signal distortion known as deterministic jitter. Because bit error rate (BER) is strongly dependent on deterministic jitter, any reduction in jitter by backdrilling significantly reduces the overall BER of an interconnection (by orders of magnitude, in some cases). Other advantages associated with backdrilling include: less signal attenuation due to improved impedance matching; increased channel bandwidth; reduced electromagnetic interface/conduction (EMI/EMC) radiation from the end of the via stub; reduced excitation of resonance modes; and reduced via-to-via crosstalk. Unfortunately, backdrilling is a costly, time-consuming process. Accordingly, a need exists for via stub elimination in printed wiring boards (PWBs) and other substrates, such as interconnect substrates.

SUMMARY

According to an embodiment, a process is disclosed that includes utilizing a pin array that includes multiple segmented pins for forming selectively plated through holes. The process includes forming a printed circuit board (PCB) laminate structure that includes a plurality of spinel-doped core layers and a plurality of through holes. Each spinel-doped core layer includes a heat-activated spinel material incorporated into a dielectric material. The process includes aligning individual segmented pins of a plurality of segmented pins of a pin array with corresponding through holes of the plurality of through holes of the PCB laminate structure. Each segmented pin includes heated segment(s) and insulating segment(s). The process includes inserting the plurality of segmented pins of the pin array into the corresponding through holes. The process further includes generating heat within each heated pin segment that is sufficient to form metal nuclei sites in selected regions of the spinel-doped core layers adjacent to portions of the through holes that contain the heated segment(s) of the pins. The metal nuclei sites function as seed layers to enable formation of selectively plated through holes.

According to another embodiment, a process of forming a selectively plated through hole is disclosed. The process includes aligning a segmented pin of a pin array with a first through hole of a plurality of through holes of a PCB laminate structure. The PCB laminate structure includes a plurality of spinel-doped core layers that include a heat-activated spinel material incorporated into a dielectric material. A first portion of the segmented pin corresponds to a heated segment, and a second portion of the segmented pin corresponds to an insulating segment. The process includes inserting the segmented pin into the first through hole. The heated segment of the segmented pin is disposed within the first through hole adjacent to a first spinel-doped core layer, and the insulating segment is disposed within the first through hole adjacent to a second spinel-doped core layer. The process also includes utilizing a resistive heating element disposed within the first portion of the segmented pin to generate heat within the heated segment that is sufficient to form metal nuclei sites in an adjacent region of the first spinel-doped core layer. The insulating segment thermally insulates the second spinel-doped core layer from the heated segment. The process further includes, after removing the pin array from the PCB laminate structure, performing an electroless plating operation to selectively deposit copper (Cu) plating within selected areas of the plurality of through holes to form a plurality of plated through holes (PTHs). A first PTH of the plurality of PTHs corresponding to the first through hole includes copper plating on the first spinel-doped core layer but does not include copper plating on the second spinel-doped core layer.

According to another embodiment, a process of forming a pin array that includes multiple segmented pins for forming selectively plated through holes is disclosed. The process includes receiving design information for a PCB laminate structure that includes a plurality of spinel-doped core layers and a plurality of through holes. Each spinel-doped core layer of the plurality of spinel-doped core layers includes a heat-activated spinel material incorporated into a dielectric material. The process also includes utilizing the design information to generate a pin array design for a pin array that includes a plurality of segmented pins configured to align with corresponding through holes of the plurality of through holes of the PCB laminate structure. Each segmented pin of the plurality of segmented pins includes one or more heated segments and one or more insulating segments. The process further includes fabricating the pin array based on the pin array design.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
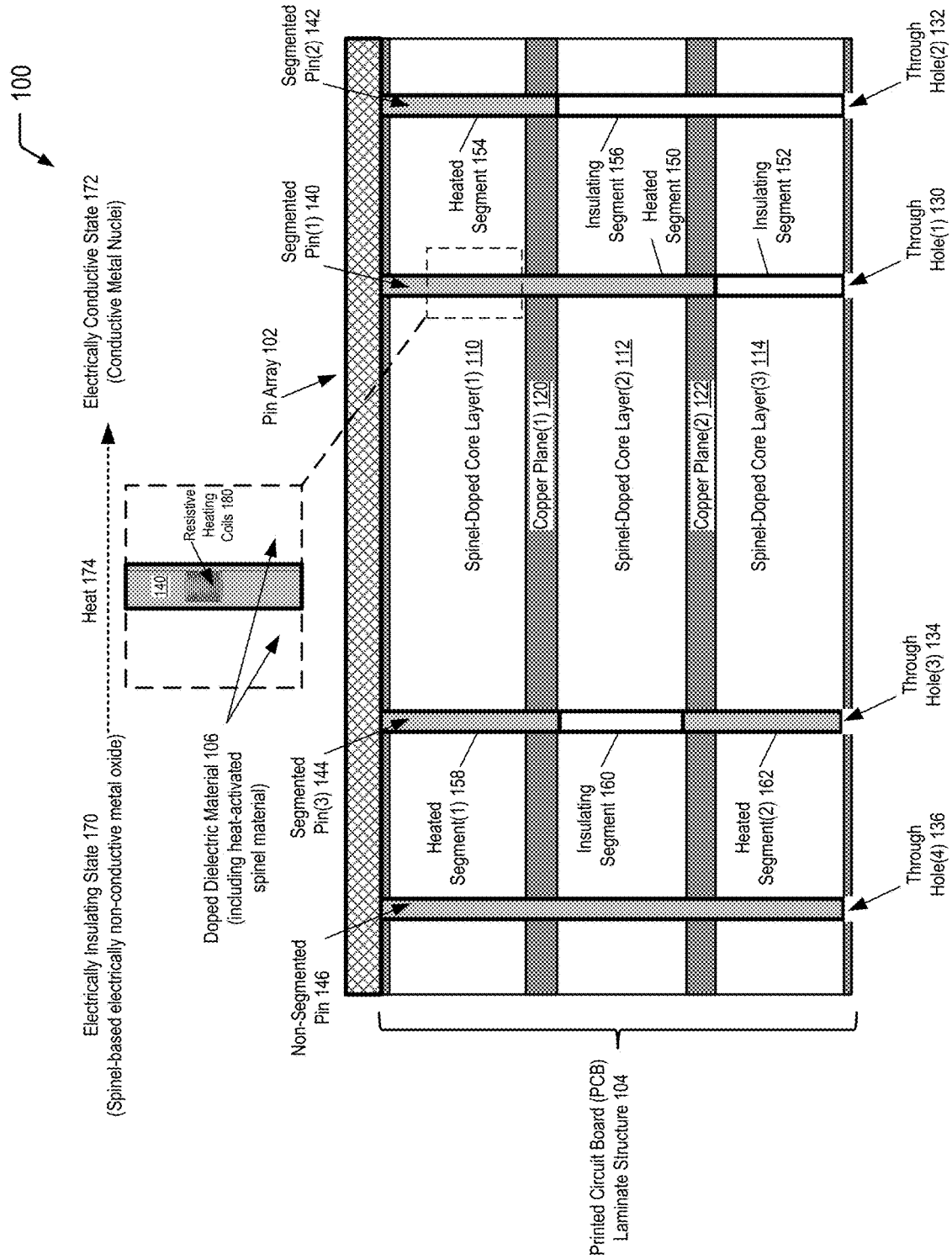
FIG. 1 is a diagram illustrating a system that utilizes a pin array that includes multiple segmented pins for forming selectively plated through holes, according to one embodiment.

The present disclosure describes systems and methods for selectively plating particular sections of individual through holes of a printed circuit board (PCB) to form plated through holes (PTHs) without backdrilling to remove via stubs. In the present disclosure, for a particular PCB design that includes a plurality of through holes, location information for the individual through holes may be utilized to design pins for each of the individual through holes. The pins may be assembled into a holder (also referred to herein as a "pin array" or a "bed-of-nails heated pin array") that is designed for the pins to align with the associated through holes of the board (prior to electroless plating of the through holes). The pin array includes pins that include at least one heated segment (with an internal resistive heating element) and at least one thermally insulating segment (also referred to herein as "segmented pins"). A heated segment of a pin enables heating of the pin within a particular region of the through hole (e.g., to a particular depth from a top surface of the board), and an insulating segment of the pin thermally insulates the pin within another region of the through hole (e.g., from the particular depth to a bottom surface of the board). As described further herein, a resistive heating element disposed within a pin may enable internal generation of heat within the heated segment of the pin.

For a particular PCB design, a PCB laminate structure may include multiple layers of dielectric material that serve as insulating layers to electrically isolate multiple copper planes within the PCB laminate structure. In the present disclosure, a spinel material may be dispersed in the dielectric material to form a layer of doped dielectric material (also referred to herein as a "spinel-doped insulator layer" or a "spinel-doped core layer"). The spinel material (also referred to herein as a "a heat-activated spinel material") corresponds to a material that transitions from an electrically insulating state (e.g., an electrically non-conductive metal oxide) to an electrically conductive state (e.g., conductive metal nuclei) when exposed to sufficient heat.

As described further herein, after insertion of the pins of the pin array into corresponding through holes of the PCB laminate structure, the resistive heating elements may be used to generate heat to transition the heat-activated spinel material in areas of the spinel-doped core layers adjacent to the heated segments from the electrically insulating state to the electrically conductive state. As described further herein, the metal nuclei (e.g., copper (Cu) nuclei) function as a seed layer for subsequent electroless plating (e.g., electroless Cu plating) after removal of the pin array. Other areas of the spinel-doped core layers adjacent to the insulating segments of the pins are thermally isolated from the heat, thereby preventing the formation of such a seed layer in those areas. Thus, the segmented pins of the present disclosure may enable selective plating of particular area(s) of individual through holes of a PCB laminate structure without backdrilling to remove via stubs.

Referring to FIG. 1, a diagram illustrates a system 100 that utilizes a pin array 102 that includes multiple segmented pins for forming a printed circuit board that includes selectively plated through holes, according to one embodiment. FIG. 1 illustrates a cross-sectional view of a portion of a PCB laminate structure 104 that includes multiple core layers, multiple copper planes, and multiple through holes. It will be appreciated that the PCB laminate structure 104 depicted in FIG. 1 represents an illustrative, non-limiting example and that alternative numbers and/or arrangements are possible. In FIG. 1, the pins of the pin array 102 are shown as being inserted into the through holes of the PCB laminate structure 104. As illustrated and described further herein with respect to FIGS. 2A and 2B, the through holes of the PCB laminate structure 104 of FIG. 1 may first be drilled (FIG. 2A) followed by alignment and insertion of the pins of the pin array 102 into the through holes (FIG. 2B). Thus, FIG. 1 depicts a particular stage of a PCB fabrication process after through hole formation and insertion of the pin array 102 but prior to pin heating operations and subsequent removal of the pin array 102 for selective electroless plating operations, as illustrated and described further herein with respect to FIGS. 2C and 2D.

FIG. 1 depicts an illustrative, non-limiting example in which the PCB laminate structure 104 includes three core layers (referred to herein as "spinel-doped core layers") formed from a doped dielectric material 106 that includes a heat-activated spinel material. In the particular stage of the PCB fabrication process depicted in FIG. 1, the heat-activated spinel material may correspond to a spinel-based electrically non-conductive metal oxide dopant. The three core layers depicted in FIG. 1 include a first spinel-doped core layer 110 (identified as "Spinel-Doped Core Layer(1)" in FIG. 1), a second spinel-doped core layer 112 (identified as "Spinel-Doped Core Layer(2)" in FIG. 1), and a third spinel-doped core layer 114 (identified as "Spinel-Doped Core Layer(3)" in FIG. 1). In the example of FIG. 1, the first spinel-doped core layer 110 is disposed between a top surface of the PCB laminate structure 104 and a first copper plane 120 (identified as "Copper Plane(1)" in FIG. 1). The second spinel-doped core layer 112 is disposed between the first copper plane 120 and a second copper plane 122 (identified as "Copper Plane(2)" in FIG. 1). The third spinel-doped core layer 114 is disposed between the second copper plane 122 and a bottom surface of the PCB laminate structure 104.

The PCB laminate structure 104 further includes a plurality of through holes. As illustrated and described further herein with respect to FIG. 2A, the through holes may be formed in the PCB laminate structure 104 by drilling prior to insertion of the pin array 102. In the particular embodiment depicted in FIG. 1, the plurality of through holes includes a first through hole 130 (identified as "Through Hole(1)" in FIG. 1), a second through hole 132 (identified as "Through Hole(2)" in FIG. 1), a third through hole 134 (identified as "Through Hole(3)" in FIG. 1), and a fourth through hole 136 (identified as "Through Hole(4)" in FIG. 1).

Figure 2A:
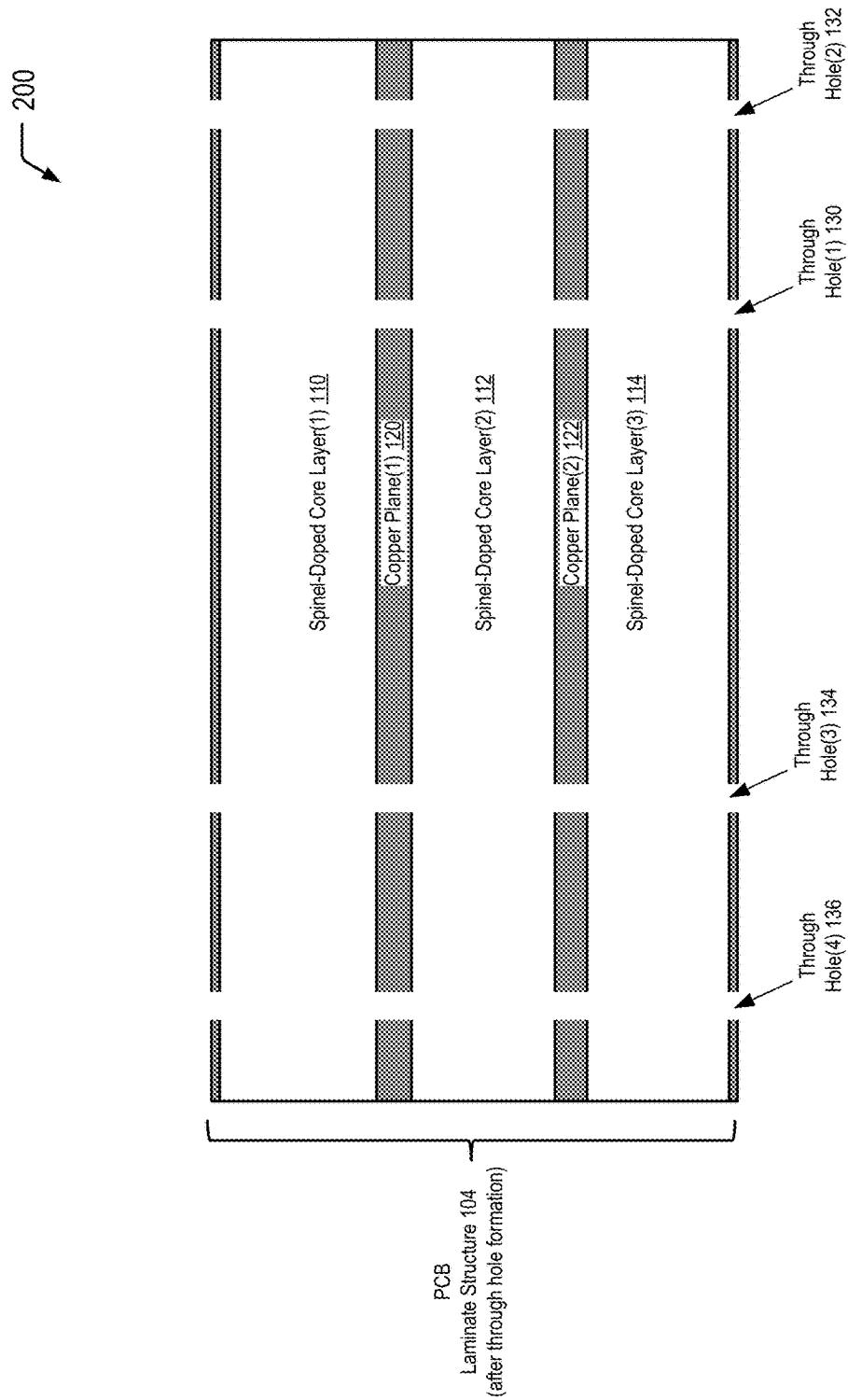
FIG. 2A is a diagram illustrating a particular stage of a printed circuit board (PCB) manufacturing process after multiple through holes have been drilled into a laminate structure and prior to electroless plating of the through holes, according to one embodiment.
Figure 2B:
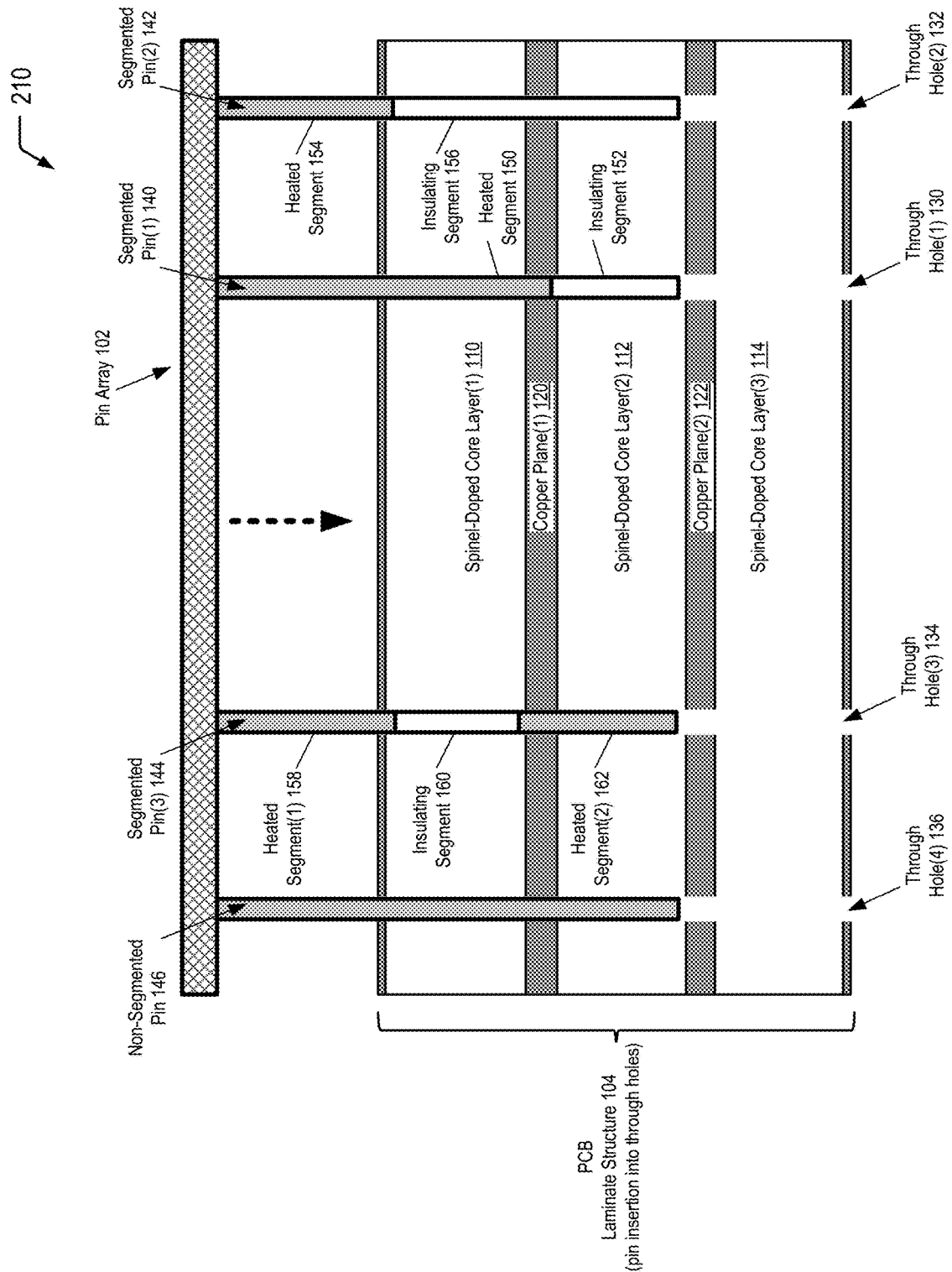
FIG. 2B is a diagram illustrating the alignment and partial insertion of the pins of the pin array of FIG. 1 into the through holes of the laminate structure depicted in FIG. 2A, according to one embodiment.
Figure 2C:
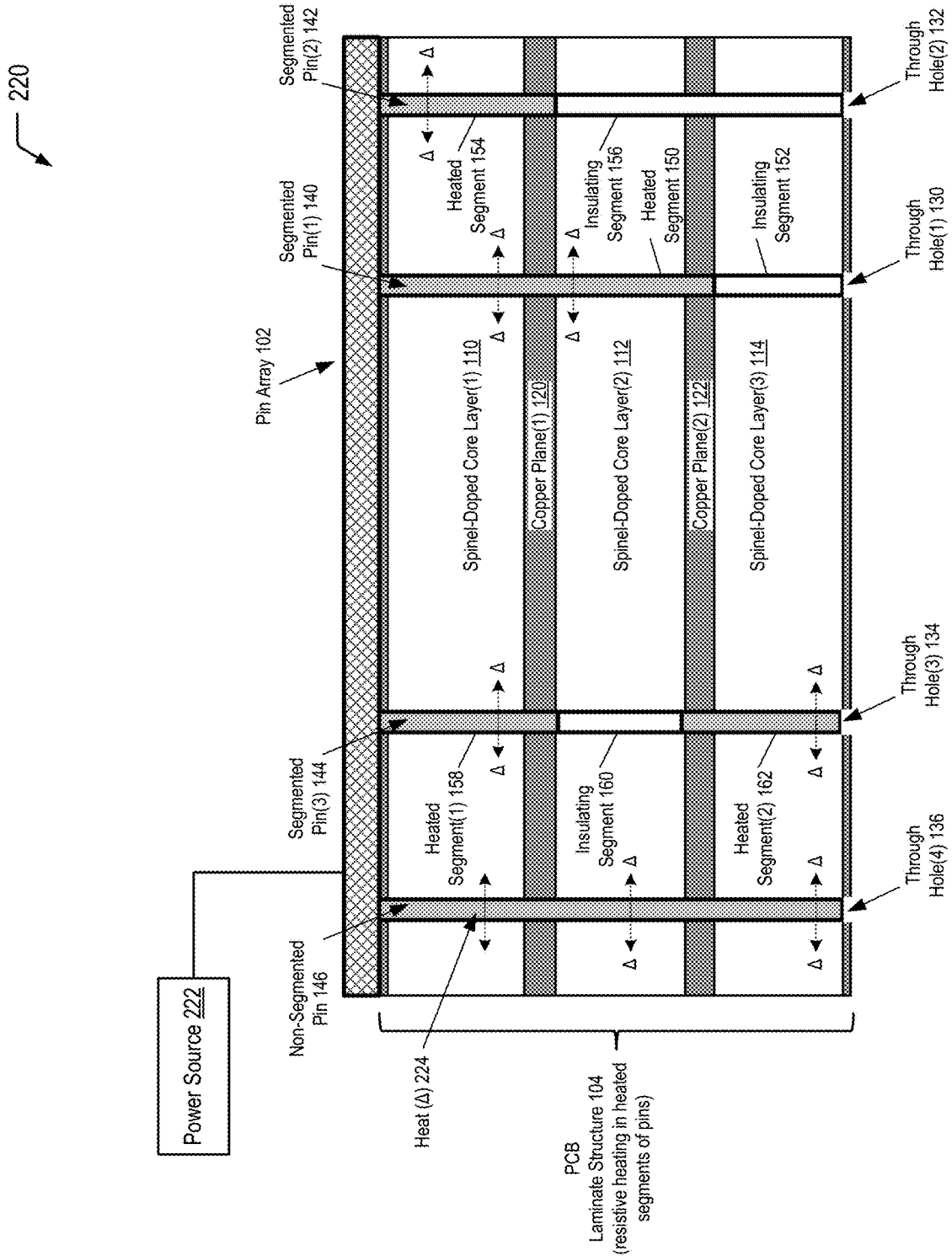
FIG. 2C is a diagram illustrating that the segmented pins of the pin array enable selective conversion of the heat-activated spinel material to form metal nuclei sites in regions of the spinel-doped cored layers adjacent to the heated segments of the pins, according to one embodiment.

FIG. 1 illustrates that the pin array 102 includes a plurality of pins that are aligned with and inserted into the corresponding through holes in the PCB laminate structure 104 to enable pin heating operations, as illustrated and further described herein with respect to FIGS. 2B and 2C. In the particular embodiment depicted in FIG. 1, the plurality of pins includes a first segmented pin 140 (identified as "Segmented Pin(1)" in FIG. 1), a second segmented pin 142 (identified as "Segmented Pin(2)" in FIG. 1), and a third segmented pin 144 (identified as "Segmented Pin(3)" in FIG. 1). FIG. 1 further illustrates that, in some embodiments, the pin array 102 may also include a non-segmented pin 146 (or multiple non-segmented pins) to enable non-selective heating of each of the spinel-doped core layers 110-114.

FIG. 1 illustrates that the first segmented pin 140 is disposed within the first through hole 130, the second segmented pin 142 is disposed within the second through hole 132, the third segmented pin 144 is disposed within the third through hole 134, and the non-segmented pin 146 is disposed within the fourth through hole 136. The segmented pins 140-144 depicted in FIG. 1 are illustrative, non-limiting examples of various segmented pin configurations that include a combination of at least one heated segment and at least one insulating segment. The first and second segmented pins 140, 142 represent examples of pin configurations that include one heated segment and one insulating segment. The third segmented pin 144 represents an example of a pin configuration that includes two heated segments and one insulating segment. It will be appreciated that a segmented pin configuration may include an alternative number and/or arrangement of heated/insulating segment(s), such as in alternative PCB laminate structures that include more than three spinel-doped core layers and/or more than two internal copper planes.

The first segmented pin 140 corresponds to a first example of a segmented pin design in which a first portion of the pin corresponds to a heated segment 150 and a second portion of the pin corresponds to an insulating segment 152. The heated segment 150 enables heating of regions of the first spinel-doped core layer 110 adjacent to the first through hole 130 as well as regions of the second spinel-doped core layer 112 adjacent to the first through hole 130. The insulating segment 152 prevents the heated segment 150 from heating of the regions of the third spinel-doped core layer 114 adjacent to the first through hole 130. As illustrated and further described herein with respect to FIG. 2D, the first segmented pin 140 may enable formation of a via that extends to the second copper plane 122 without backdrilling to remove a via stub beneath the second copper plane 122.

The second segmented pin 142 corresponds to a second example of a segmented pin design in which a first portion of the pin corresponds to a heated segment 154 and a second portion of the pin corresponds to an insulating segment 156. The heated segment 154 enables heating of regions of the first spinel-doped core layer 110 adjacent to the second through hole 132. The insulating segment 156 prevents the heated segment 154 from heating of regions of the second and third spinel-doped core layers 112, 114 adjacent to the second through hole 132. As illustrated and further described herein with respect to FIG. 2D, the second segmented pin 142 may enable formation of a via that extends to the first copper plane 120 without backdrilling to remove a via stub beneath the first copper plane 120.

The third segmented pin 144 corresponds to a third example of a segmented pin design in which a first portion of the pin corresponds to a first heated segment 158 (identified as "Heated Segment(1)" in FIG. 1), a second portion of the pin corresponds to an insulating segment 160, and a third portion of the pin corresponds to a second heated segment 162 (identified as "Heated Segment(2)" in FIG. 1). The first heated segment 158 enables heating of regions of the first spinel-doped core layer 110 adjacent to the third through hole 134. The second heated segment 162 enables heating of regions of the third spinel-doped core layer 114 adjacent to the third through hole 134. The insulating segment 160 prevents the heated segments 158 and 162 from heating of regions of the second spinel-doped core layer 112 adjacent to the third through hole 134. As illustrated and further described herein with respect to FIG. 2D, the third segmented pin 144 may enable formation of a plated through hole in which the first copper plane 120 is electrically isolated from the second copper plane 122.

In the particular embodiment illustrated in FIG. 1, the pin array 102 further includes the non-segmented pin 146 that does not include an insulating segment. The non-segmented pin 146 enables heating of regions of each of the spinel-doped core layers 110-114 adjacent to the fourth through hole 136. As illustrated and further described herein with respect to FIG. 2D, the non-segmented pin 146 may enable formation of a conventional through hole via.

In the particular embodiment depicted in FIG. 1, each of the spinel-doped core layers 110-114 includes a heat-activated spinel material that may transition from an electrically insulating state 170 to an electrically conductive state 172 when exposed to sufficient heat 174. In the electrically insulating state 170, the spinel material may correspond to a spinel-based electrically non-conductive metal oxide. In the electrically conductive state 172, the spinel material may correspond to electrically conductive metal nuclei. As illustrated and further described herein with respect to FIGS. 2C and 2D, the metal nuclei sites function as seed layers for selective electroless plating of particular areas within the individual through holes adjacent to heated regions of particular spinel-doped core layers.

The spinel-based electrically non-conductive metal oxide may be, for example, spinel-based higher oxides which contain at least two different kinds of cations and have a spinel structure or spinel-related structure, and which break up to create metal nuclei in a heated region of an insulator layer but remain unchanged in other areas of the insulator layer. Examples of spinel materials include mixed metal oxides of magnesium and aluminum, but the magnesium may be wholly or partially replaced by iron, zinc and/or manganese, and the aluminum may be wholly or partially replaced by iron and/or chromium. Spinel-related mixed oxide structures also may contain nickel and/or cobalt. It may be advantageous if the spinel or spinel-related structure contains copper, chromium, iron, cobalt, nickel or a mixture of two or more of the foregoing. Copper may be particularly advantageous (e.g., the copper-containing spinel PK 3095 made by Ferro GmbH). Those skilled in the art will appreciate, however, that any suitable spinel-based electrically non-conductive metal oxide may be utilized.

FIG. 1 illustrates a selected portion (identified by dashed lines) of the cross-sectional view of the PCB laminate structure 104 in an exploded view to show a portion of the heated segment 150 of the first segmented pin 140 and regions of the first spinel-doped core layer 110 adjacent to the heated segment 150 corresponding to the "walls" of the first through hole 130 (viewed in cross-section) drilled into the PCB laminate structure 104. The exploded view illustrates that resistive heating coils 180 may be disposed within the heated segment 150 of the first segmented pin 140. As illustrated and further described herein with respect to FIG. 2C, the pin array 102 may be electrically connected to a power source (not shown in FIG. 1) to provide current to the resistive heating coils 180 to generate sufficient heat 174 to break down the spinel-based electrically non-conductive metal oxide to release metal nuclei into regions of the first spinel-doped core layer 110 that are adjacent to the first through hole 130. The metal nuclei sites function as seed layers for selective electroless plating, as illustrated and further described herein with respect to FIGS. 2C and 2D. While not shown in FIG. 1, it will be appreciated that the resistive heating coils 180 depicted in the exploded cross-sectional view may extend along a length of the heated segment 150 to generate sufficient heat 174 to break down the spinel-based electrically non-conductive metal oxide to release metal nuclei into regions of the second spinel-doped core layer 112 that are adjacent to the first through hole 130.

Further, while not shown in FIG. 1, it will be appreciated that similar resistive heating coils may be disposed within the heated segment 154 of the second segmented pin 142 to generate sufficient heat 174 to break down the spinel-based electrically non-conductive metal oxide to release metal nuclei into regions of the first spinel-doped core layer 110 that are adjacent to the second through hole 132. While not shown in FIG. 1, in the case of the third segmented pin 144, a first set of resistive heating coils may be disposed within the first heated segment 158 to generate sufficient heat 174 to break down the spinel-based electrically non-conductive metal oxide to release metal nuclei into regions of the first spinel-doped core layer 110 that are adjacent to the third through hole 134. The first set of resistive heating coils may be electrically connected (e.g., via a wire through the insulating segment 160) to a second set of resistive heating coils disposed within the second heated segment 162. The second set of resistive heating coils may generate sufficient heat 174 to break down the spinel-based electrically non-conductive metal oxide to release metal nuclei into regions of the third spinel-doped core layer 114 that are adjacent to the third through hole 134. Additionally, while not shown in FIG. 1, it will be appreciated that similar resistive heating coils may be disposed within the non-segmented pin 146 to generate sufficient heat 174 to break down the spinel-based electrically non-conductive metal oxide to release metal nuclei into regions of each of the spinel-doped core layers 110-114 that are adjacent to the fourth through hole 136.

Thus, FIG. 1 illustrates an example of a system that utilizes a pin array that includes multiple segmented pins for forming a printed circuit board that includes selectively plated through holes. FIG. 1 further illustrates that the pin array may also include non-segmented pin(s) to enable formation of a conventional through hole via. Selective plating of the through holes enables PTHs to be formed in the printed circuit board without backdrilling to remove via stubs.

Figure 2D:
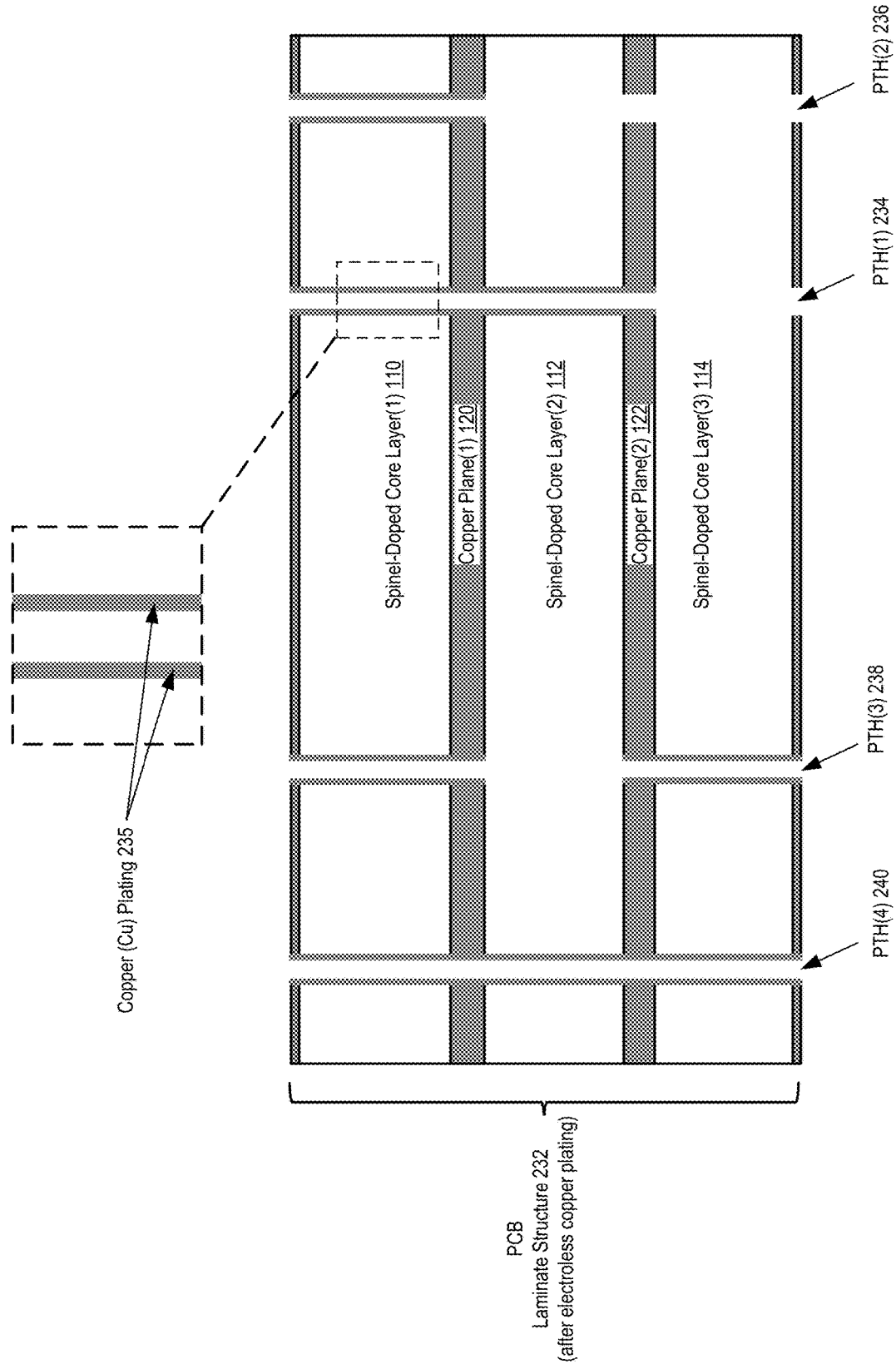
FIG. 2D is a diagram illustrating a PCB laminate structure after an electroless plating stage of the PCB manufacturing process that results in selective plating of the through holes of the PCB laminate structure depicted in FIG. 2C, according to one embodiment.

FIGS. 2A to 2D illustrate various stages of an example of PCB manufacturing process that utilizes the pin array including segmented pins of the present disclosure for forming selectively plated through holes, according to one embodiment. FIG. 2A illustrates that one stage of the PCB manufacturing process may include drilling the through holes 130-136 of the PCB laminate structure 104 depicted in FIG. 1. FIGS. 2B and 2C illustrate the alignment and insertion of the pins 140-146 of the pin array 102 into the corresponding through holes 130-136 for selective heating to release metal nuclei into selected regions of the spinel-doped core layers 110-114. FIG. 2D illustrates that the metal nuclei sites function as seed layers for forming selectively plated through holes without backdrilling to remove via stubs.

Referring to FIG. 2A, a diagram 200 illustrates a particular stage of a PCB manufacturing process after forming a laminate structure and drilling each of the through holes 130-136 into the laminate structure, according to one embodiment. The resulting laminate structure depicted in FIG. 2A corresponds to the PCB laminate structure 104 depicted in FIG. 1. Referring to FIG. 2B, a diagram 210 illustrates the alignment and partial insertion of the pins 140-146 of the pin array 102 into the corresponding through holes 130-136 of the PCB laminate structure 104, according to one embodiment.

Referring to FIG. 2C, a diagram 220 illustrates that a power source 222 (not shown in FIG. 1) may be electrically connected to the pin array 102. The power source 222 may provide current to the resistive heating elements (e.g., the resistive heating coils 180 depicted in FIG. 1) disposed within the individual pins 140-146 to generate heat (Δ) 224. For example, the power source 222 may provide current to the heated segment 150 of the first segmented pin 140 to generate heat 224 that flows into regions of the first and second spinel-doped core layers 110, 112 that are adjacent to the first through hole 130. As another example, the power source 222 may provide current to the heated segment 154 of the second segmented pin 142 to generate heat 224 that flows into a region of the first spinel-doped core layer 110 adjacent to the second through hole 132. As a further example, the power source 222 may provide current to a first set of resistive heating elements within the first heated segment 158 of the third segmented pin 144 to generate heat 224 that flows into a region of the first spinel-doped core layer 110 adjacent to the third through hole 134. As previously described herein with respect to FIG. 1, the first set of resistive heating elements may be electrically connected to a second set of resistive heating elements disposed within the second heated segment 162 of the third segmented pin 144 (e.g., via a wire through the insulating segment 160) to enable the current from the power source 222 to flow into the second heated segment 162. The current generates heat 224 within the second heated segment 162 that flows into a region of the third spinel-doped core layer 114 adjacent to the third through hole 134. As a further example, the power source 222 may provide current to resistive heating elements disposed within the non-segmented pin 146 to generate heat 224 that flows into regions of each of spinel-doped core layers 110-114 that are adjacent to the fourth through hole 136.

Referring to FIG. 2D, a diagram 230 illustrates a cross-sectional view of a PCB laminate structure 232 after an electroless (e.g., Cu) plating stage of the PCB manufacturing process, according to one embodiment. After performing the heating operations described with respect to FIG. 2C and subsequently removing the pin array 102 from the PCB laminate structure 104, FIG. 2D illustrates that the metal nuclei sites function as seed layers to enable formation of PTHs without backdrilling to remove via stubs.

FIG. 2D illustrates that electroless plating of the first through hole 130 of FIG. 2C results in the formation of a first PTH 234 (identified as "PTH(1)" in FIG. 2D). FIG. 2D illustrates that the metal nuclei sites formed in the regions of the first and second spinel-doped core layers 110, 112 that are adjacent to the first through hole 130 function as seed layers to enable formation of copper plating 235 on the surfaces of the first and second spinel-doped core layers 110, 112 that are exposed after removal of the first segmented pin 140 from the first through hole 130. FIG. 2D further illustrates that the heat-activated spinel material within the third spinel-doped core layer 114 remains in the electrically insulating state 170, thereby preventing formation of copper plating on the surface of the third spinel-doped core layer 114 that is exposed after removal of the first segmented pin 140 from the first through hole 130.

FIG. 2D further illustrates that electroless plating of the second through hole 132 of FIG. 2C results in the formation of a second PTH 236 (identified as "PTH(2)" in FIG. 2D). The metal nuclei sites formed in the regions of the first spinel-doped core layer 110 adjacent to the second through hole 132 function as a seed layer to enable formation of copper plating 235 on the surface of the first spinel-doped core layer 110 that is exposed after removal of the second segmented pin 142 from the second through hole 132. The heat-activated spinel material within the second and third spinel-doped core layers 112, 114 remains in the electrically insulating state 170, thereby preventing formation of copper plating on the surfaces of the second and third spinel-doped core layers 112, 114 that are exposed after removal of the second segmented pin 142 from the second through hole 132.

FIG. 2D further illustrates that electroless plating of the third through hole 134 of FIG. 2C results in the formation of a third PTH 238 (identified as "PTH(3)" in FIG. 2D). The metal nuclei sites formed in the regions of the first spinel-doped core layer 110 adjacent to the third through hole 134 function as a seed layer to enable formation of copper plating 235 on the surface of the first spinel-doped core layer 110 that is exposed after removal of the third segmented pin 144 from the third through hole 134. The heat-activated spinel material within the second spinel-doped core layer 112 remains in the electrically insulating state 170, thereby preventing formation of copper plating on the surface of the second spinel-doped core layer 112 that is exposed after removal of the third segmented pin 144 from the third through hole 134. The metal nuclei sites formed in the regions of the third spinel-doped core layer 114 adjacent to the third through hole 134 function as a seed layer to enable formation of copper plating 235 on the surface of the third spinel-doped core layer 114 that is exposed after removal of the third segmented pin 144 from the third through hole 134.

FIG. 2D further illustrates that electroless plating of the fourth through hole 136 of FIG. 2C results in the formation of a fourth PTH 240 (identified as "PTH(4)" in FIG. 2D). The metal nuclei sites formed in the regions of the spinel-doped core layers 110-114 adjacent to the fourth through hole 136 function as seed layers to enable formation of copper plating 235 on the surfaces of the spinel-doped core layers 110-114 that are exposed after removal of the non-segmented pin 146 from the fourth through hole 136. The fourth PTH 240 represents an example of a conventional through hole via that may be formed utilizing a non-segmented pin.

Figure 3:
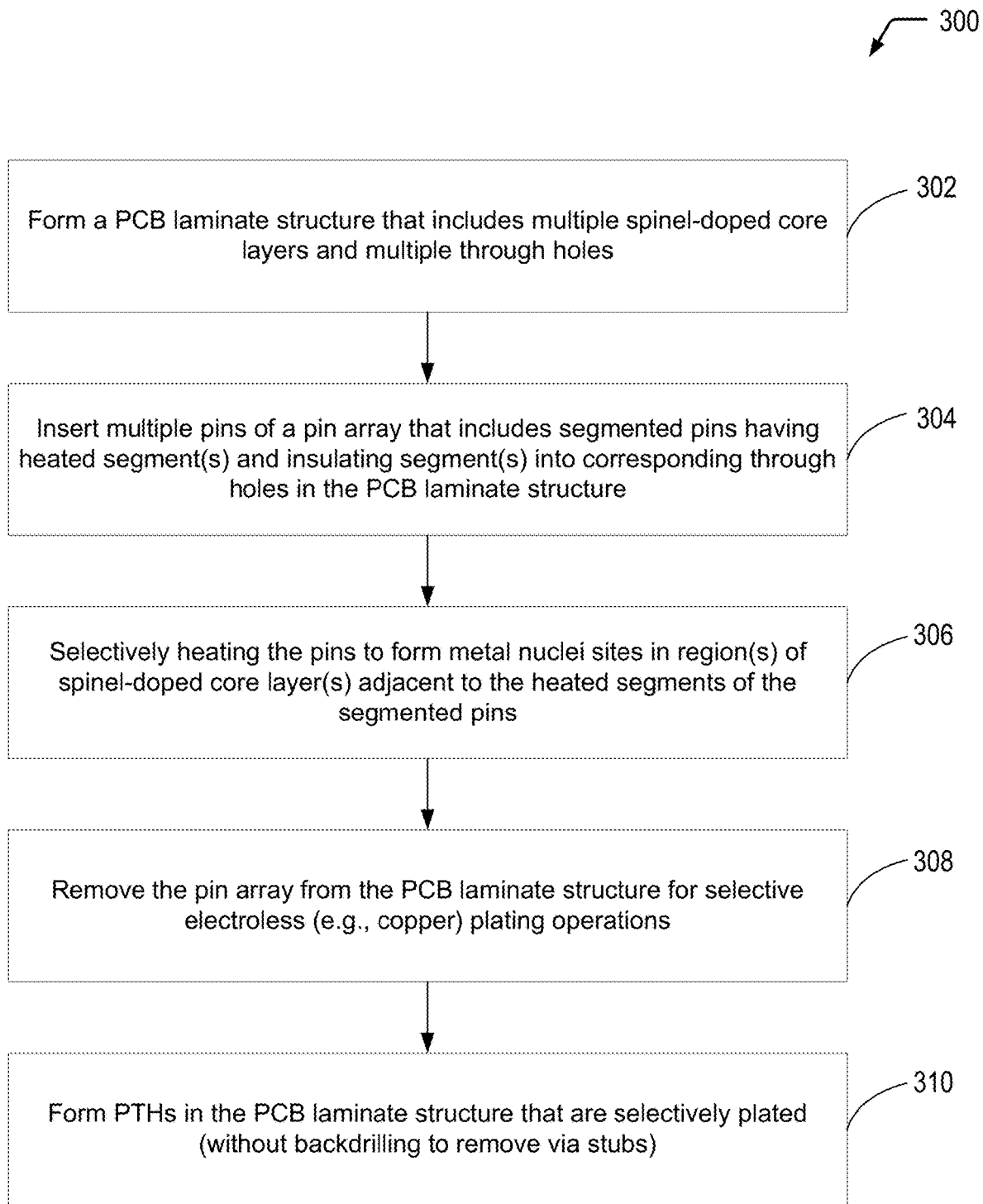
FIG. 3 is a flow diagram depicting a process 300 of utilizing a pin array that includes multiple segmented pins for forming selectively plated through holes, according to one embodiment.

Referring to FIG. 3, a flow diagram illustrates a particular embodiment of a process 300 of utilizing a pin array that includes multiple segmented pins for forming selectively plated through holes. In the particular embodiment depicted in FIG. 3, the process also includes performing electroless plating operations to form PTHs that are selectively plated (without backdrilling to remove via stubs). It will be appreciated that the operations shown in FIG. 3 are for illustrative purposes only and that the operations may be performed in alternative orders, at alternative times, by a single entity or by multiple entities, or a combination thereof. As an example, one entity may form the PCB laminate structure (illustrated as operation 302) while another entity may form the pin array for insertion into the PCB laminate structure (illustrated as operation 304). In some cases, the same entity or a different entity may utilize the pin array for selective heating prior to performing electroless plating (illustrated as operations 306 and 308). Further, the same entity or a different entity may perform the electroless plating operations to form PTHs that are selectively Cu-plated without backdrilling to remove via stubs (illustrated as operation 310).

The process 300 includes forming a PCB laminate structure that includes multiple spinel-doped core layers and multiple through holes, at 302. For example, referring to FIG. 2A, the PCB laminate structure 104 of FIG. 1 may be formed by drilling through holes into a laminate structure that includes multiple spinel-doped core layers. In the particular embodiment depicted in FIGS. 1 and 2A, the PCB laminate structure 104 includes three spinel-doped core layers 110-116 adjacent to two internal copper planes 120, 122 and four through holes 130-136.

The process 300 includes inserting multiple pins of a pin array that includes segmented pins having one or more heated segments and one or more insulating segments into corresponding through holes in the PCB laminate structure, at 304. For example, FIG. 2B illustrates the alignment and partial insertion of the pins 140-146 of the pin array 102 into the corresponding through holes 130-136 of the PCB laminate structure 104 of FIG. 2A. FIG. 1 illustrates full insertion of the pins 140-146 into the corresponding through holes 130-136 of the PCB laminate structure 104. In the particular embodiment depicted in FIG. 1, the pin array 102 includes the first segmented pin 140, the second segmented pin 142, and the third segmented pin 144. The first segmented pin 140 includes the heated segment 150 and the insulating segment 152, and the second segmented pin 142 includes the heated segment 154 and the insulating segment 156. The third segmented pin 144 includes the first heated segment 158, the insulating segment 160, and the second heated segment 162. FIG. 1 illustrates a particular embodiment in which the pin array 102 optionally includes the non-segmented pin 146 (for conventional through hole via formation).

The process 300 includes selectively heating the pins to form metal nuclei sites in regions of the spinel-doped core layers adjacent to the heated segments of the pins, at 308. For example, referring to FIG. 2C, the power source 222 may provide current to the resistive heating elements (e.g., the resistive heating coils 180 depicted in FIG. 1) disposed within the individual pins 140-146 to generate heat (Δ) 224. For example, the power source 222 may provide current to the heated segment 150 of the first segmented pin 140 to generate heat 224 that flows into regions of the first and second spinel-doped core layers 110, 112 that are adjacent to the first through hole 130. As another example, the power source 222 may provide current to the heated segment 154 of the second segmented pin 142 to generate heat 224 that flows into a region of the first spinel-doped core layer 110 adjacent to the second through hole 132. As a further example, the power source 222 may provide current to a first set of resistive heating elements within the first heated segment 158 of the third segmented pin 144 to generate heat 224 that flows into a region of the first spinel-doped core layer 110 adjacent to the third through hole 134. As previously described herein with respect to FIG. 1, the first set of resistive heating elements may be electrically connected to a second set of resistive heating elements disposed within the second heated segment 162 of the third segmented pin 144 (e.g., via a wire through the insulating segment 160) to enable the current from the power source 222 to flow into the second heated segment 162. The current generates heat 224 within the second heated segment 162 that flows into a region of the third spinel-doped core layer 114 adjacent to the third through hole 134. As a further example, the power source 222 may provide current to resistive heating elements disposed within the non-segmented pin 146 to generate heat 224 that flows into regions of each of spinel-doped core layers 110-114 that are adjacent to the fourth through hole 136.

The process 300 includes removing the pin array from the PCB laminate structure for selective electroless plating operations, at 308. For example, after performing the selective heating operations, the pin array 102 depicted in FIG. 2C may be removed from the PCB laminate structure 104.

In the particular embodiment depicted in FIG. 3, the process 300 further includes forming PTHs in the PCB laminate structure that are selectively plated (without backdrilling to remove via stubs), at 310. For example, referring to FIG. 2D, electroless copper plating operations may result in selective formation of the Cu plating 235 within the through holes 130-136 depicted in FIG. 2C. To illustrate, the first PTH 234 of FIG. 2D includes the Cu plating 235 adjacent to the first and second spinel-doped core layers 110, 112 but does not include copper plating adjacent to the third spinel-doped core layer 114. The second PTH 236 of FIG. 2D includes the Cu plating 235 adjacent to the first spinel-doped core layer 110 but does not include copper plating adjacent to the second and third spinel-doped core layers 112, 114. The third PTH 238 of FIG. 2D includes the Cu plating 235 adjacent to the first and third spinel-doped core layers 110 and 114 but does not include copper plating adjacent to the second spinel-doped core layer 112. The fourth PTH 240 of FIG. 2D represents an example of a conventional through hole via that includes the Cu plating 235 adjacent to each of the spinel-doped core layers 110-114.

Thus, FIG. 3 illustrates an example of a process of utilizing a pin array that includes multiple segmented pins for forming selectively plated through holes (without backdrilling to remove via stubs).

Figure 4:
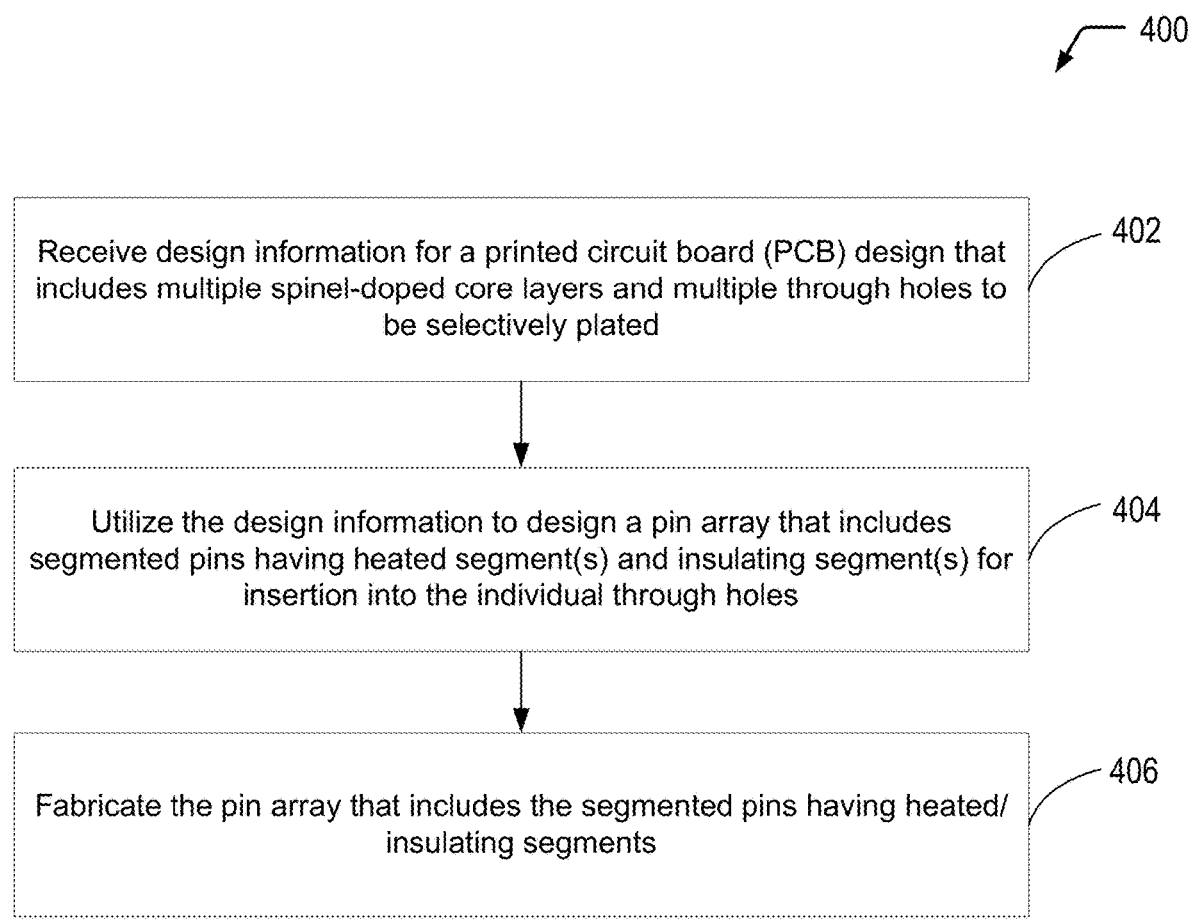
FIG. 4 is a flow diagram depicting a process of utilizing PCB design information to fabricate a pin array that includes multiple segmented pins for forming selectively plated through holes, according to one embodiment.

Referring to FIG. 4, a flow diagram illustrates a particular embodiment of a process 400 of utilizing PCB design information to fabricate a pin array that includes multiple segmented pins (having heated/insulating segments) for forming a PCB having selectively plated through holes. It will be appreciated that the operations shown in FIG. 4 are for illustrative purposes only and that the operations may be performed in alternative orders, at alternative times, by a single entity or by multiple entities, or a combination thereof.

The process 400 includes receiving design information for a PCB design that includes multiple spinel-doped core layers and multiple through holes to be selectively plated, at 402. For example, the design information may include information associated with the PCB laminate structure 232 depicted in FIG. 2D. In the particular embodiment depicted in FIG. 2D, the PCB laminate structure 232 includes the three spinel-doped core layers 110-114 adjacent to the two internal copper planes 120, 122 and the three PTHs 234-238 that are selectively plated with the Cu plating 235. FIG. 2D further illustrates that, in some cases, the PCB design may include one or more PTHs to be non-selectively plated. To illustrate, the fourth PTH 240 represents an example of a PTH that includes the Cu plating 235 along the length of through hole.

The process 400 includes utilizing the design information to design a pin array that includes segmented pins having heated/insulating segments for insertion into the individual through holes, at 404. For example, in the particular embodiment depicted in FIG. 1, the pin array 102 includes the first segmented pin 140 (for insertion into the first through hole 130), the second segmented pin 142 (for insertion into the second through hole 132), and the third segmented pin 144 (for insertion into the third through hole 134).

The first segmented pin 140 includes the heated segment 150 (including the internal resistive heating coils 180) designed to generate sufficient heat 174 to form metal nuclei sites in regions of the first and second spinel-doped core layers 110, 112 adjacent to the first through hole 130. The first segmented pin 140 includes the insulating segment 152 designed to thermally insulate the third spinel-doped core layer 114 to prevent formation of the metal nuclei sites in a region of the third spinel-doped core layer 114 adjacent to the first through hole 130.

The second segmented pin 142 includes the heated segment 154 (including internal resistive heating elements similar to the resistive heating coils 180) designed to generate sufficient heat 174 to form metal nuclei sites in a region of the first spinel-doped core layer 110 adjacent to the second through hole 132. The second segmented pin 142 includes the insulating segment 156 designed to thermally insulate the second and third spinel-doped core layers 112, 114 to prevent formation of the metal nuclei sites in regions of the second and third spinel-doped core layers 112,114 adjacent to the second through hole 132.

The third segmented pin 144 includes the first heated segment 158, the insulating segment 160, and the second heated segment 162. The first heated segment 158 (including a first set of internal resistive heating elements similar to the resistive heating coils 180) is designed to generate sufficient heat 174 to form metal nuclei sites in a region of the first spinel-doped core layer 110 adjacent to the third through hole 134. The second heated segment 162 (including a second set of internal resistive heating elements similar to the resistive heating coils 180) is designed to generate sufficient heat 174 to form metal nuclei sites in a region of the third spinel-doped core layer 114 adjacent to the third through hole 134. The insulating segment 160 is designed to thermally insulate the second spinel-doped core layer 112 to prevent formation of the metal nuclei sites in a region of the second spinel-doped core layer 112 adjacent to the third through hole 134.

FIG. 1 illustrates a particular embodiment in which the pin array 102 optionally includes the non-segmented pin 146 (for conventional through hole via formation). The non-segmented pin 146 includes internal resistive heating elements (similar to the resistive heating coils 180) designed to generate sufficient heat 174 to form metal nuclei sites in regions of the spinel-doped core layers 110-114 adjacent to the fourth through hole 136.

The process 400 includes fabricating the pin array, at 406. For example, the pin array 102 depicted in FIG. 1 (also referred to herein as a "bed-of-nails heated pin array") may be fabricating by forming each of the pins 140-146 attached to a holder to enable simultaneous alignment of each of the pins 140-146 with the corresponding through holes 130-136 of the PCB laminate structure 104.

Thus, FIG. 4 illustrates an example of a process of utilizing PCB design information to fabricate a pin array that includes multiple segmented pins (having heated/insulating segments) for forming a PCB having selectively plated through holes (without backdrilling to remove via stubs).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A process of utilizing a pin array that includes multiple segmented pins for forming selectively plated through holes, the process comprising:

forming a printed circuit board (PCB) laminate structure that includes a plurality of spinel-doped core layers and a plurality of through holes, wherein each spinel-doped core layer of the plurality of spinel-doped core layers includes a heat-activated spinel material incorporated into a dielectric material;

aligning individual segmented pins of a plurality of segmented pins of a pin array with corresponding through holes of the plurality of through holes of the PCB laminate structure, wherein each segmented pin of the plurality of segmented pins includes one or more heated segments and one or more insulating segments;

inserting the plurality of segmented pins of the pin array into the corresponding through holes;

generating heat within each heated segment of the plurality of segmented pins that is sufficient to form metal nuclei sites in selected regions of the plurality of spinel-doped core layers that are adjacent to portions of the individual through holes that contain the one or more heated segments of the individual segmented pins, wherein the metal nuclei sites function as seed layers to enable formation of selectively plated through holes.

2. The process of claim 1, further comprising:
removing the pin array from the PCB laminate structure; and
performing electroless plating to form the selectively plated through holes.

3. The process of claim 1, wherein the heat-activated spinel material incorporated into the dielectric material corresponds to a spinel-based electrically non-conductive metal oxide.

4. The process of claim 3, wherein the spinel-based electrically non-conductive metal oxide includes a spinel-based higher oxide containing at least two different cation types and that has a spinel structure or a spinel-related structure.

5. The process of claim 3, wherein the spinel-based electrically non-conductive metal oxide includes a mixed metal oxide.

6. The process of claim 3, wherein the spinel-based electrically non-conductive metal oxide includes a copper-containing material.

7. The process of claim 3, wherein each spinel-doped insulator layer of the plurality of spinel-doped insulator layers is formed from a pre-impregnated material that is doped with the spinel-based electrically non-conductive metal oxide.

8. The process of claim 1, wherein the pin array further includes one or more non-segmented pins.

9. The process of claim 8, wherein the one or more non-segmented pins enable formation of a non-selectively plated through hole.

10. A process of forming a selectively plated through hole, the process comprising:
aligning a segmented pin of a pin array with a first through hole of a plurality of through holes of a printed circuit board (PCB) laminate structure that includes a plurality of spinel-doped core layers that include a heat-activated spinel material incorporated into a dielectric material, wherein a first portion of the segmented pin corresponds to a heated segment, and wherein a second portion of the segmented pin corresponds to an insulating segment;

inserting the segmented pin into the first through hole, wherein the heated segment of the segmented pin is disposed within the first through hole adjacent to a first spinel-doped core layer of the plurality of spinel-doped core layers, and wherein the insulating segment of the segmented pin is disposed within the first through hole adjacent to a second spinel-doped core layer of the plurality of spinel-doped core layers;

utilizing a resistive heating element disposed within the first portion of the segmented pin to generate heat within the heated segment that is sufficient to form metal nuclei sites in an adjacent region of the first spinel-doped core layer, wherein the insulating segment thermally insulates the second spinel-doped core layer from the heated segment; and after removing the pin array from the PCB laminate structure, performing an electroless plating operation to selectively deposit copper (Cu) plating within selected areas of the plurality of through holes to form a plurality of plated through holes (PTHs), wherein a first PTH of the plurality of PTHs corresponding to the first through hole includes copper plating on the first spinel-doped core layer but does not include copper plating on the second spinel-doped core layer.

11. The process of claim 10, wherein the heat-activated spinel material incorporated into the dielectric material corresponds to a copper-containing spinel-based electrically non-conductive metal oxide.

12. The process of claim 10, wherein the metal nuclei sites in the adjacent region of the first spinel-doped core layer function as a seed layer for copper plating.

13. The process of claim 10, wherein the resistive heating element includes resistive heating coils.

14. The process of claim 13, wherein the segmented pin includes an encapsulating material to surround the resistive heating coils.

15. The process of claim 13, wherein resistive heating coils are formed from a nickel-chromium (Ni—Cr) alloy.

16. The process of claim 10, wherein the segmented pin further includes a third portion corresponding to a second heated segment, and wherein the second heated segment of the segmented pin is disposed within the first through hole adjacent to a third spinel-doped core layer of the plurality of spinel-doped core layers, the process further comprising:
utilizing a second resistive heating element disposed within the third portion of the segmented pin to generate heat within the second heated segment that is sufficient to form metal nuclei sites in an adjacent region of the third spinel-doped core layer, wherein the insulating segment thermally insulates the second spinel-doped core layer from the second heated segment, and wherein the first PTH further includes copper plating on the third spinel-doped insulator layer.

17. The process of claim 16, wherein the insulating segment includes a wire to electrically connect the resistive heating element disposed within the first portion of the segmented pin to the second resistive heating element disposed within the third portion of the segmented pin.

* * * * *